United States Patent
Härdin et al.

[11] Patent Number: 6,128,190
[45] Date of Patent: Oct. 3, 2000

[54] ELECTRONIC ASSEMBLY

[75] Inventors: Bengt Yngve Härdin, Kista; Nils Martin Schöön, Solna, both of Sweden

[73] Assignee: Telefonaktiebolaget L M Ericsson, Stockholm, Sweden

[21] Appl. No.: 09/177,823

[22] Filed: Oct. 23, 1998

[30] Foreign Application Priority Data

Oct. 29, 1997 [SE] Sweden .................................. 9703961

[51] Int. Cl.[7] ...................................................... H05H 7/20
[52] U.S. Cl. ..................... 361/704; 165/80.2; 165/80.3; 174/16.3; 257/719; 257/727; 361/710; 361/719; 361/769; 361/809; 361/820
[58] Field of Search ................................ 165/80.2, 80.3, 165/185; 174/16.3; 257/718–719, 726–727, 706–707, 712–713; 361/704, 707, 709–710, 719, 720, 767, 769, 809–811, 820; 439/73, 91, 331, 525, 527, 485, 487

[56] References Cited

U.S. PATENT DOCUMENTS

| | | | |
|---|---|---|---|
| 5,065,280 | 11/1991 | Karnezos et al. | 361/704 |
| 5,176,524 | 1/1993 | Mizuno et al. | 439/91 |
| 5,392,193 | 2/1995 | Robertson, Jr. et al. | 361/704 |
| 5,426,405 | 6/1995 | Miller et al. | 257/726 |
| 5,530,291 | 6/1996 | Chan et al. | 257/726 |
| 5,825,089 | 10/1998 | Valenti et al. | 257/718 |

FOREIGN PATENT DOCUMENTS 2121353  5/1990  Japan ...................................... 257/718

*Primary Examiner*—Gregory D. Thompson
*Attorney, Agent, or Firm*—Albihns Stockholm AB; Albihn Stockholm AB

[57] ABSTRACT

An aluminum heat sink bridge (1), mounted overlying a transistor unit (5) on a circuit board (12), has affixed to its underside, along two lateral edges, a pair of resilient plastic or rubber members (4), which, when the bridge is screwed down into place, exert continuous vertical pressure on the collector tab (8) and the base tab (7) keeping them in electrical contact with their underlying electrical contact points on the circuit board (12) while permitting horizontal movement of the tabs due to variations in temperature. One embodiment of the invention has resilient members extending the entire length of the bridge to exert vertical pressure on grounding tabs (9) extending laterally from the ends of the transistor unit.

8 Claims, 2 Drawing Sheets

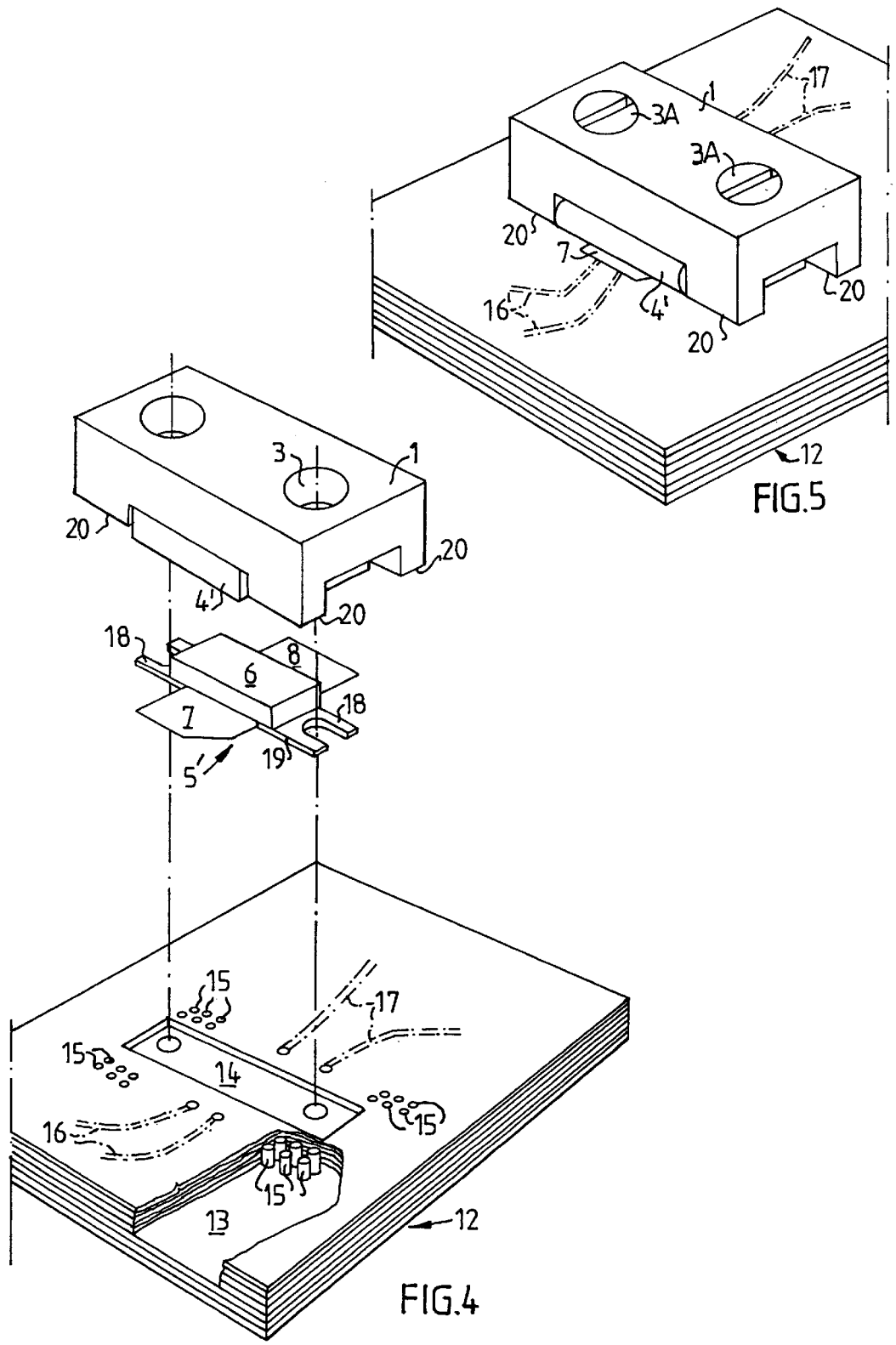

ELECTRONIC ASSEMBLY

BACKGROUND OF THE INVENTION

1) Field of the Invention

The present invention relates to a clamp an electronic assembly comprising connecting a power transistor to an underlying conducting layer. The clamp has a acting as a holder and heat sink and may also constitute an electromagnetic barrier between the input and output sides of the power transistor. It provides a solderless connections for the transistor base and collector to the underlying circuit board.

2) Discussion of Related Art

Many electronics applications use electronic components such as high power transistors which generate comparatively large amounts of heat. One such application is the radio frequency (RF) power amplifier at the output stage of a radio transceiver. Such a circuit element generates in a very limited area a substantial amount of heat as well as electromagnetic (EM) emission.

A solution to these problems is provided in our own co-pending U.S. patent application No. 08/640,256 (Myrberg) filed on 30 Apr. 1996 (corresponding to PCT SE97/00706, published on 7 Nov. 1997. It describes a heat sink bridge between the two mounting/grounding flanges at the ends of the transistor, spanning the transistor and holding it in place on the circuit board by means of screws extending through respective ends of the bridge and respective mounting flanges. In addition to the mounting and heat sink functions it also acts as an electromagnetic barrier.

The base and collector tabs extending from the transistor transversely with respect to the mounting/grounding flanges have in this case hitherto been manually soldered or glued to the circuit board. As the power amplifier is frequently turned on and off for radio transmission there is a risk that these solder joints will crack as the different materials expand and contract due to temperature variations. Cyclic shear stresses are induced in the solder joints due to the different heat expansion coefficients of the circuit board and the transistor package.

It is known by inter alia U.S. Pat. No. 4,597,617 and U.S. Pat. No. 5,099,393 to mount an integrated circuit on a circuited substrate by using pressure pads to establish and maintain contact between the conducting parts of the IC and the substrate. These two references do not relate to the mounting of power transistors and the problems of thermic stress associated therewith.

SUMMARY OF THE INVENTION

The present invention solves these and other problems in the mounting of power transistors by providing a transistor clamp, which, while providing the advantages of the bridge described in our copending application cited above, i.e. of secure and easy screw mounting and grounding of the transistor, heat sinking and electromagnetic shielding, is also provided with lateral elastic pads which press the transistor base and collector tabs into contact with the underlying conducting copper surfaces of the circuit board. This solution provides secure electrical coupling of the transistor to the circuit board without the disadvantages of a soldered connection, i.e. eventual cracking of the solder joint at its edges and subsequent failure, as a result of repeated temperature variations. High strength solders may increase the useful lifetime of the joint but they also have higher melting temperatures which induce unwanted stresses in the components. All of the problems involved in soldering or gluing the tabs of transistors to circuit boards are completely obviated by the solution according to the invention, which establishes the electrical coupling automatically when the (heat sink) bridge is screwed in place. The invention also makes automated assembly possible. These clamps can be very useful in experimental contexts and other contexts where it is necessary to remove and connect various transistor units such as for repair or upgrading.

BRIEF DESCRIPTION OF THE DRAWINGS

The present invention will now be described with reference to the exemplary embodiments illustrated in the accompanying drawings in which:

FIG. 4 shows an exploded view of a second embodiment of the clamp, the transistor package being in a more usual commonly manufactured form, and the multi-layer circuit board 12 to which the transistor and clamp are to be securely screwed;

and FIG. 5 shows the components shown in FIG. 4 when screwed together and to the underlying carrier (not shown).

FIGS. 1a–d show the clamp in various views. It is comprised of a bridge portion 1 made of an appropriate heat conductive material such as aluminum, copper, iron etc. and feet 2 designed to be in contact with mounting and grounding flanges on a transistor unit when the clamp holds the transistor unit in place. Through the bridge 1 and each of the feet 2 there is a through hole 3 for a screw or other fastener. It is also possible to fasten the clamp by means of clips. Along the underside of the bridge, flush with each lateral sides of the bridge 1, are situated longitudinal cushions 4 of resilient plastic or rubber which may be fastened by vulcanizing or gluing to keep them in position during mounting.

FIG. 2 shows the transistor unit 5 to be mounted as well as the clamp. The transistor unit consists of the transistor itself 6 mounted securely on a pedestal 11. Extending from the transistor proper 6 are the base tab 7 and the collector tab 8 as well as the two grounding wings 9.

FIGS. 2 and 3 show how the clamp according to the invention is secured by means of screws 3A on top of a transistor unit to secure the same in a circuit board and electrically connect the base and collector tabs 7 and 8 to the copper trace conductors of the underlying circuit board (not shown) by continuous vertical pressure exerted by the compressed longitudinal cushions 4.

Figure 1A:
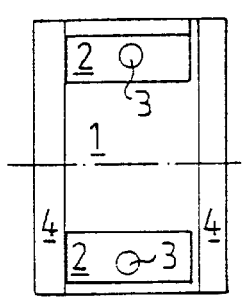
FIGS. 1a–d show bottom, side, top and end views respectively of a first embodiment of the clamp according to the invention.
Figure 1B:
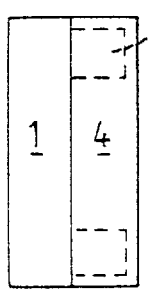
Figure 1C:
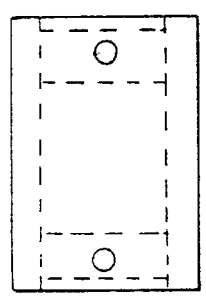
Figure 1D:
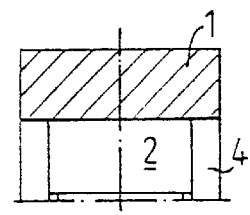

The pedestal 11 is typically made of a copper alloy and is fitted in a cut-out in the circuit board (s) and rests on the carrier of the device. When screwed down into place the feet 2 of the bridge 1 press the mounting and grounding flanges 10 of the pedestal 11 against the carrier, holding the transistor package in place in its cut-out in the circuit board(s). This establishes a heat dissipating connection from the heat generating transistor both downwards to the carrier and upwards to the device cover (not shown) which is in contact with the bridge. This heat dissipation function is the same as that described in the above mentioned co-pending PCT SE97/00706.

Simultaneously, and without any further effort or steps, the base tab 7 and the collector tab 8 are pressed by the elastic cushions into electrical contact with the appropriate underlying copper traces on the circuit board. This contact allows the tabs 7 and 8 to move slightly during expansion and contraction due to temperature variations, in contrast to previously known soldered or glued joints which eventually fail due to fatigue stresses and require extra work to achieve with possible damage by heat, solder or glue to the adjacent components.

According to one particular variant of the present invention, the resilient cushions extend to the respective ends of the bridge, and thus also press down laterally extending wings 9 into contact with conducting via-hole arrays which establish electrical contact between the wings 9 and the grounding layer in a multi-layer circuit board. It is advantageous for mounting and inspection to have all the electrical connections including the grounding connection in a single plane. With this embodiment of the invention, all of these connections are established automatically in one plane without soldering and with the advantages for temperature expansion and contraction described earlier.

Figure 2:
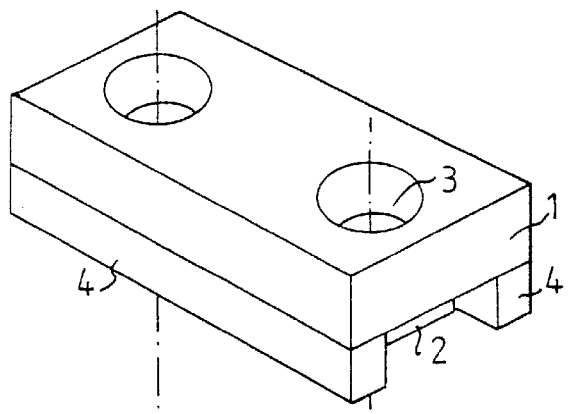
FIG. 2 shows schematically in perspective the clamp of the first embodiment shown in FIG. 1 and a transistor prior to clamping of the transistor to a circuit board (not shown in this figure)
Figure 3:
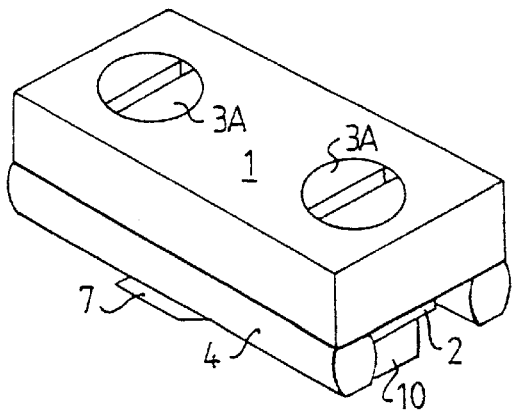
FIG. 3 shows schematically in perspective the clamp and the transistor of FIG. 2 when the transistor is clamped to the circuit board (not shown in this figure)

A further embodiment of the inventive clamp is shown in FIGS. 4 and 5 where parts identical to those shown in FIGS. 1, 2 and 3 have been given the same reference numerals. FIG. 4 shows an exploded view of the clamp in another embodiment than previously shown, the transistor package in a more usual commonly manufactured form, and the multi-layer circuit board 12 to which the transistor, placed in the cut-out and clamp are to be securely screwed. Such multi-layer circuit boards may be used e.g. in compact radio base stations, containing all electronics.

FIG. 5 shows the components in their assembled positions with the screws 3A holding together the clamp, the transistor package 5', the multi-layered circuit board 12 and the underlying frame (not shown). In this case the transistor package does not have wings 9 as in the embodiment described in connection with FIGS. 2 and 3. Rather it is in the more usual commercially available configuration with forked ends 18 to partially surround the screws. In this case a grounding (and cooling) connection is established between the clamp, the via-holes 15 and the fifth (grounding) layer 13 to which the conducting via holes lead. For this purpose the feet 2 of the bridge 1 are extended to include portions 20 which are pressed into direct contact with the via holes 15 when the bridge is screwed in place. The circuit board shown here consists of 8 different layers sandwiched together, of which the fifth layer 13 is the common ground layer in order to achieve feasible dimensions for proper impedance matching geometrics.

FIGS. 4 and 5 schematically indicate the conducting copper trace patterns 16 and 17 respectively against which the longitudinal resilient members 4' press the base tab 7 and the collector tab 8 respectively. In this case as well, the electrical connections, which will not break when subjected to repeated thermal expansion and contraction, for the base and the collector, are established without any soldering or gluing when the heat dissipating bridge 1 is screwed in place.

The clamps may of course be joined or combined in various ways side-by-side and/or end-to-end to form a multiple clamp for a plurality of transistor units.

What is claimed is:

1. Assembly comprising:
   (a) a circuit board,
   (b) a transistor unit having a transistor body (6) and two mounting ends, receiving fastener means, as well as a collector tab (8) and a base tab (7) which extend transversely with respect to the ends of the transistor unit from opposite sides of the transistor unit,
   (c) a clamp with fastening means whereby the transistor unit is secured to the circuit board, said clamp comprising a bridge (1) overlying and holding the transistor unit in a secured position on the circuit board, said clamp further comprising a pair of longitudinally extending resilient means depending from the underside of said bridge (1) on opposite lateral sides thereof, resting on either side of said transistor body and under compression pressing the collector tab (8) and the base tab (7) against underlying electrically contacting portions (17 and 16 respectively) of the circuit board (12) said bridge having at each end a foot (2) in non-resilient abutment against said mounting end of the transistor unit.

2. Assembly according to claim 1, characterized in that the longitudinally extending resilient means (4) extend along the entire length of the bridge (1).

3. Assembly according to claim 1, characterized in that the longitudinally extending resilient means depending from the underside of the bridge on opposite lateral sides thereof only extend along a mid-portion of the bridge covering only the collector tab and the base tab of the transistor.

4. Assembly according to one of the preceding claims, characterized in that the clamp is provided with holes (3) through the bridge (1) for fastening means (3A) designed to extend through the bridge (1), the mounting ends (10; 18) of the transistor unit, and the circuit board for holding the transistor unit in its secured position on the circuit board.

5. Assembly according to claim 4, characterized said fastening means are screws (3A).

6. Assembly according to claim 1 characterized in that said resilient means are elastic cushions.

7. Assembly according to claim 6 characterized in that said elastic cushions are vulcanized onto the underside of the bridge.

8. Assembly according to claim 6 characterized in that said elastic cushions are glued onto the underside of the bridge.

\* \* \* \* \*